United States Patent
Pant et al.

(10) Patent No.: US 6,232,776 B1
(45) Date of Patent: May 15, 2001

(54) MAGNETIC FIELD SENSOR FOR ISOTROPICALLY SENSING AN INCIDENT MAGNETIC FIELD IN A SENSOR PLANE

(75) Inventors: Bharat B. Pant, Minneapolis; Hong Wan, Maple Grove, both of MN (US)

(73) Assignee: Honeywell Inc., Morristown, NJ (US)

( * ) Notice: Subject to any disclaimer, the term of this patent is extended or adjusted under 35 U.S.C. 154(b) by 0 days.

(21) Appl. No.: 08/993,214

(22) Filed: Dec. 18, 1997

(51) Int. Cl.[7] .............................. G01R 33/09; H01L 43/08
(52) U.S. Cl. .................. 324/252; 324/207.21; 338/32 R; 360/326; 428/900
(58) Field of Search .......................... 324/207.2, 207.21, 324/251, 252, 173, 174, 610, 651, 706; 338/32 R; 360/113, 326; 365/8; 428/900

(56) References Cited

U.S. PATENT DOCUMENTS

| | | | |
|---|---|---|---|
| 3,546,579 | * 12/1970 | Paul et al. | 324/252 |
| 4,048,557 | * 9/1977 | Chen | 324/252 X |
| 4,668,914 | * 5/1987 | Kersten et al. | 324/207.2 X |
| 5,038,130 | * 8/1991 | Eck et al. | 324/207.21 X |
| 5,251,170 | 10/1993 | Daughton et al. | 365/158 |
| 5,420,819 | 5/1995 | Pohm | 365/158 |
| 5,424,236 | 6/1995 | Daughton et al. | 437/52 |
| 5,538,800 | * 7/1996 | Jin et al. | 324/252 X |
| 5,569,544 | 10/1996 | Daughton | 428/611 |
| 5,595,830 | 1/1997 | Daughton | 428/611 |
| 5,617,071 | 4/1997 | Daughton | 338/32 |
| 5,636,159 | 6/1997 | Pohm | 365/158 |
| 5,650,721 | * 7/1997 | van den Berg et al. | 324/252 X |
| 5,686,837 | * 11/1997 | Coehoorn et al. | 324/252 |
| 5,744,950 | * 4/1998 | Seefeldt et al. | 324/252 X |
| 5,767,673 | * 6/1998 | Batlogg et al. | 324/252 |
| 5,792,569 | * 8/1998 | Sun et al. | 324/252 X |
| 5,835,003 | * 11/1998 | Nickel et al. | 324/207.21 X |

OTHER PUBLICATIONS

Helmolt et al., Intrinsic giant magnetoresistance of mixed valence La–A–Mn oxide (A=Ca,Sr,Ba)(invited), *J. Appl. Physics*, Nov. 15, 1994, 4 pages.

Jin et al., "Thousandfold Change in Resistivity in Magnetoresistive La–Ca–Mn–O Films", *Science*, vol. 264, 413, Apr. 1994, 3 pages.

Fontcuberta et al., "Chemical tuning of the colossal magnetoresistance of ferromagnetic perovskites", *Europhys. Lett*, 34 (5), 6 pages.

Laffez et al, "Structural Phase Transition at Low Temperature, Corresponding to Charge Ordering in the CMR . . .", *Materials Research Bulletin*, vol. 31, No. 8, 1996, 7 pages.

* cited by examiner

Primary Examiner—Gerard R. Strecker
(74) Attorney, Agent, or Firm—Kris T. Fredrick

(57) ABSTRACT

A magnetic field sensor that isotropically senses an incident magnetic field. This is preferably accomplished by providing a magnetic field sensor device that has one or more circular shaped magnetoresistive sensor elements for sensing the incident magnetic field. The magnetoresistive material used is preferably isotropic, and may be a CMR material or some form of a GMR material. Because the sensor elements are circular in shape, shape anisotropy is eliminated. Thus, the resulting magnetic field sensor device provides an output that is relatively independent of the direction of the incident magnetic field in the sensor plane.

12 Claims, 5 Drawing Sheets

MAGNETIC FIELD SENSOR FOR ISOTROPICALLY SENSING AN INCIDENT MAGNETIC FIELD IN A SENSOR PLANE

This invention was made with Government support under NASA contract NAS3-27809 entitled "Giant Magnetoresistive Oxide Sensors". The Government has certain rights in the invention.

BACKGROUND OF THE INVENTION

1. Field of the Invention

The present invention generally relates to magnetic field sensor devices and more particularly relates to such devices that measure the amplitude of an incident magnetic field in a sensor plane.

2. Description of the Prior Art

Magnetometers and other magnetic sensing devices have many diverse applications including automobile detection, proximity sensors, magnetic disk memories, magnetic tape storage systems, magnetic strip readers, etc. Such devices typically provide one or more output signals that represent the magnetic field sensed by the magnetic sensing device.

Magnetic sensor devices typically include one or more sensor elements that are formed from a magnetoresistive material. The resistance of a magnetoresistive material typically changes when exposed to an incident magnetic field. Thus, to detect an incident magnetic field, most magnetic sensor devices simply sense the change in the resistance of the magnetoresistive material, and provide an output signal that indicates the presence of, or has an amplitude that is a function of, the incident magnetic field.

Common magnetoresistive materials include Anisotropic Magnetoresistive (AMR) materials, Giant Magnetoresistive (GMR) materials, and Colossal Magnetoresistive (CMR) materials. The resistance of AMR materials typically only changes a few percent change when exposed to an incident magnetic field. AMR materials are typically anisotropic with respect to the supplied current direction and incident field direction. Under limited conditions, however, AMR materials can be isotropic with respect to the incident field direction.

The resistance of GMR materials can change several hundred percent when exposed to an incident field. GMR materials are typically formed using multilayer films to produce a giant magnetoresistive effect. GMR materials are typically isotropic with respect to current direction, but can be anisotropic or isotropic with respect to the incident field direction depending on the type of crystal and shape structure. AMR and GMR materials are further discussed in U.S. Pat. No. 5,569,544 to Daughton.

CMR materials have the greatest magnetoresistive effect in response to an incident magnetic field. The resistance of a CMR material can change up to a $10^6$ percent. Most CMR materials are intrinsically isotropic in nature with respect to the supplied current and the incident magnetic field direction.

The response curve for a magnetoresistive material is often defined with the amplitude of the incident magnetic field along the X-axis, and the resulting resistance of the magnetoresistive material along the Y-axis. CMR and some GMR magnetoresistive materials can often have both a symmetrical and isotropic response curve. A symmetrical response curve is one that is symmetrical about the Y-Axis. That is, the magnetoresistive material satisfies the equation $R(H)=R(-H)$, where H is the incident magnetic field.

For CMR and some GMR magnetoresistive materials, the response curve is not perfectly symmetrical because of hysteresis effects. FIG. 1 shows a response curve for a typical CMR magnetoresistive material. The response curve is nearly symmetrical ($R(H) \approx R(-H)$) about H=0, with some hysteresis shown. For CMR and some GMR magnetoresistive materials, the hysteresis effects are small and can be effectively ignored except in the most sensitive magnetic sensor applications. As indicated above, the response curve of CMR and some GMR magnetoresistive materials is also isotropic. An isotropic response curve is one that is independent of the direction of the incident magnetic field, usually within a sensor plane.

FIG. 2 shows a schematic of a typical resistance measurement of a magnetoresistive film 20. Only a portion of the magnetoresistive film 20 is shown. Input current terminals 22 and 24 are electrically connected to the magnetoresistive film 20, as shown. A current source 26 is then connected between input current terminals 22 and 24 to provide a current through the magnetoresistive film 20. Output voltage terminals 28 and 30 are also electrically connected to the magnetoresistive film 20, as shown. A volt meter 32 measures the voltage generated between the output voltage terminals 28 and 30. The voltage measured by volt meter 32 is proportional to the resistance of the magnetoresistive film 20.

To measure the response curve of a magnetoresistive material, an incident magnetic field H 38 is provided to the film 20 at an angle θ 34 relative to a reference direction 36 in the sensor plane. As indicated above, CMR and some GMR magnetoresistive materials are typically isotropic, exhibiting the same response curve regardless of the direction θ 34 of the incident magnetic field in the sensor plane.

Because the amplitude of the incident magnetic field is important regardless of the direction in some applications, such as in an electromagnetic radiation monitor, it is often desirable to provide a magnetic field sensor that senses a magnetic field isotropically. In such a magnetic sensor device, the output signal is relatively independent of the direction of the incident magnetic field, at least within the sensor plane. Another advantage of sensing a magnetic field isotropically is that the sensitivity of the magnetic field sensor may be increased because all components of the magnetic field in a sensor plane are measured, resulting in a higher value of total field than a single component sensor would provide.

Despite the isotropic nature of CMR and some GMR materials, many prior art magnetic sensor devices introduce anisotropy into the response thereof. A primary limitation of many prior art magnetic sensor devices is that the shape of the magnetoresistive sensor element is rectangular or otherwise not symmetrical in the sensor plane. This typically introduces shape anisotropy into the response of the sensor. Shape anisotropy can significantly reduce the isotropic nature of the magnetic field sensor.

One approach to providing an isotropic magnetic field sensor is to use a proton precession magnetometer. A proton precession magnetometer uses the same principles as nuclear magnetic resonance (NMR). That is, the resonance frequency of a proton is dependent on the total incident magnetic field. While this approach may provide an isotropic magnetic field sensing function, the complexity and cost of such systems can be prohibitively large for many applications.

SUMMARY OF THE INVENTION

The present invention overcomes many of the disadvantages of the prior art by providing a magnetic field sensor that isotropically senses an incident magnetic field. This is preferably accomplished by providing a magnetic field sensor device that has one or more circular shaped magnetoresistive sensor elements for sensing the incident magnetic field. The magnetoresistive material used is preferably isotropic, and may be a CMR material or some form of a GMR material. Because the sensor elements are circular in shape, shape anisotropy is minimized. Thus, the resulting magnetic field sensor device provides an output that is relatively independent of the direction of the incident magnetic field in the sensor plane.

In a first illustrative embodiment, the magnetic field sensor includes a first leg and a second leg. The first leg is connected between an output net and a first power supply terminal. The second leg is connected between the output net and a second power supply terminal. To sense an incident magnetic field isotropically, at least one circular shaped sensor element formed from a magnetoresistive material is incorporated into at least one of the first and second legs. Preferably, two or more circular shaped magnetoresistive sensor elements are incorporated into either the first leg or second leg, with the other leg formed from a non-magnetoresistive material. The two or more circular shaped sensor elements are preferably connected in a series configuration via a number of non-magnetoresistive connectors to form the corresponding leg.

To maximize the sensitivity of the magnetic sensor device, the circular shaped sensor elements are preferably formed from a Colossal magnetoresistive material. However, it is contemplated that GMR materials may also be used. Illustrative Colossal magnetoresistive materials are those generally described by the formula (LnA)MnO$_3$, wherein Ln=La, Nd, or Pr and A=Ca, Sr, Ba or Pb. Preferably, the Colossal magnetoresistive material is LaCaMnO, having concentrations of La between 26–32 atomic percent, Ca between 9–20 atomic percent, and Mn between 47–64 atomic percent.

In another illustrative embodiment, the magnetic field sensor includes a first leg, a second leg, a third leg and a fourth leg. The first and second legs preferably are connected between a first output net and a second output net, respectively, and a first power supply terminal. The third and fourth legs preferably are connected between the first output net and the second output net, respectively, and a second power supply. To sense an incident magnetic field isotropically, at least one circular shaped sensor element formed from a magnetoresistive material is incorporated into at least one of the first, second, third and fourth legs. Preferably, the first and fourth legs are each formed from two or more circular shaped magnetoresistive sensor elements, with the second and third legs formed from a non-magnetoresistive material. For each of the first and fourth leg, the corresponding two or more circular shaped sensor elements are preferably connected in a series configuration via a number of non-magnetoresistive connectors to form the corresponding leg. The circularly shaped magnetoresistive sensor elements are preferably formed from the same Colossal materials as described above.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein.

DETAILED DESCRIPTION OF THE PREFERRED EMBODIMENTS

As indicated above, the present invention provides a magnetic field sensor that isotropically senses an incident magnetic field. This is preferably accomplished by providing a magnetic field sensor device that has one or more circular shaped magnetoresistive sensor elements for sensing the incident magnetic field. Because the sensor elements are circular in shape, shape anisotropy is minimized. Thus, the resulting magnetic field sensor device provides an output that is relatively independent of the direction of the incident magnetic field in the sensor plane.

Figure 3:
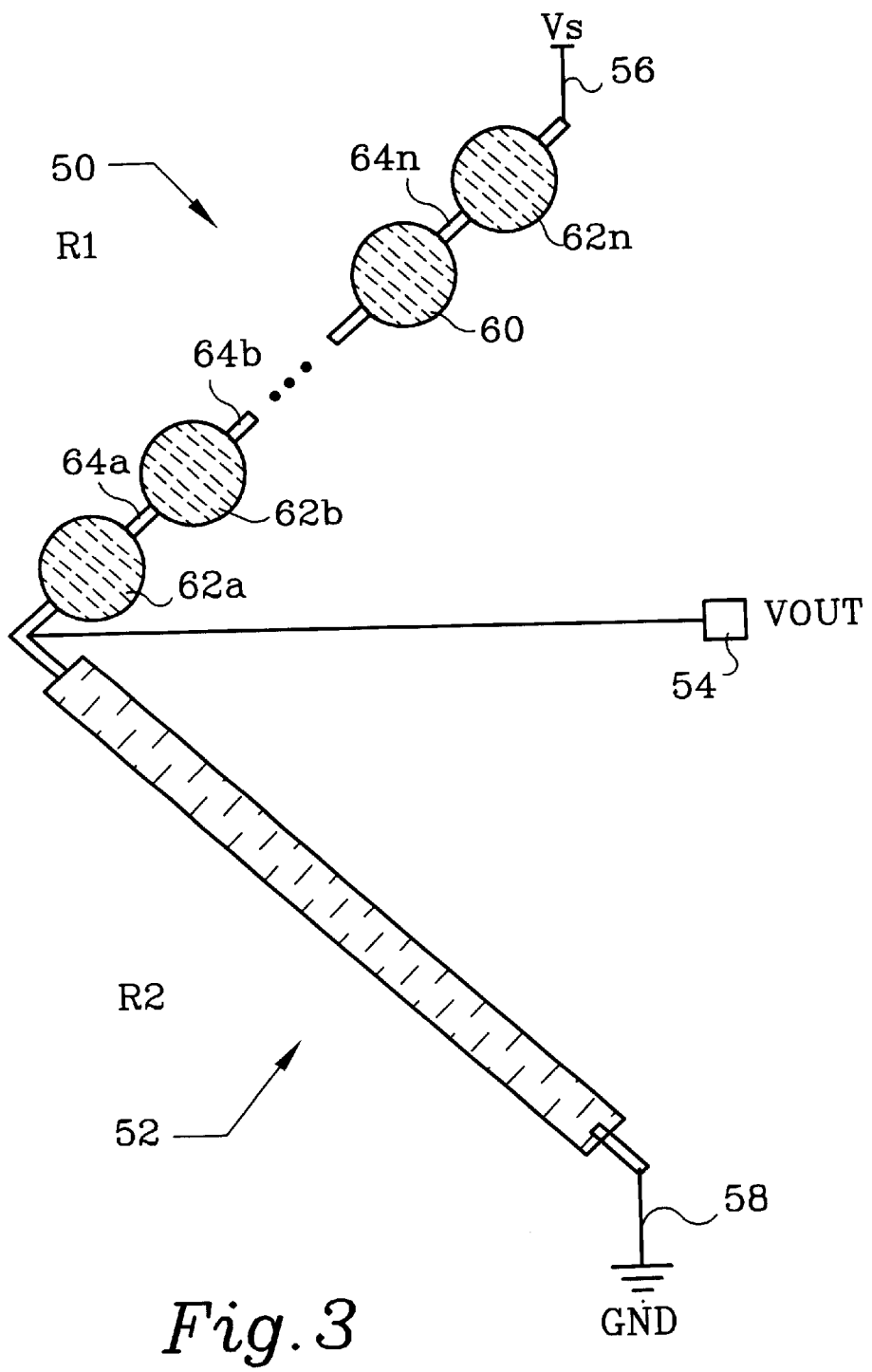
FIG. 3 is a schematic diagram of a first illustrative embodiment of the present invention.

FIG. 3 is a schematic diagram of a first illustrative embodiment of the present invention. In this embodiment, the magnetic field sensor includes a first leg 50 and a second leg 52. The first leg 50 is connected between an output net 54 and a first power supply terminal 56. The second leg 52 is connected between the output net 54 and a second power supply terminal 58. The first power supply terminal 56 is preferably connected to a first power supply voltage (Vs), and the second power supply terminal 58 is preferably connected to ground (GND). Further, the first leg preferably has a first resistance R1, and the second leg preferably has a second resistance R2. In this configuration, the output voltage Vout at the output net 54 is given by the equation:

$$V_{out} = V_s \left[ \frac{R2}{R1 + R2} \right] \quad (1)$$

To sense an incident magnetic field isotropically, at least one circular shaped sensor element 60 formed from a magnetoresistive material is incorporated into at least one of the first and second legs. Preferably, two or more circular shaped magnetoresistive sensor elements 62a–62n are incorporated into the first leg 50 as shown, with the second leg 52 formed from a non-magnetoresistive material. The two or more circular shaped sensor elements 62a–62n are preferably connected in a series configuration as shown, via a number of non-magnetoresistive connectors 64a–64n, to form the first leg 50. To adjust the resistance of the first leg to a desired value, the number and size of the circular shaped elements can be varied.

Figure 1:
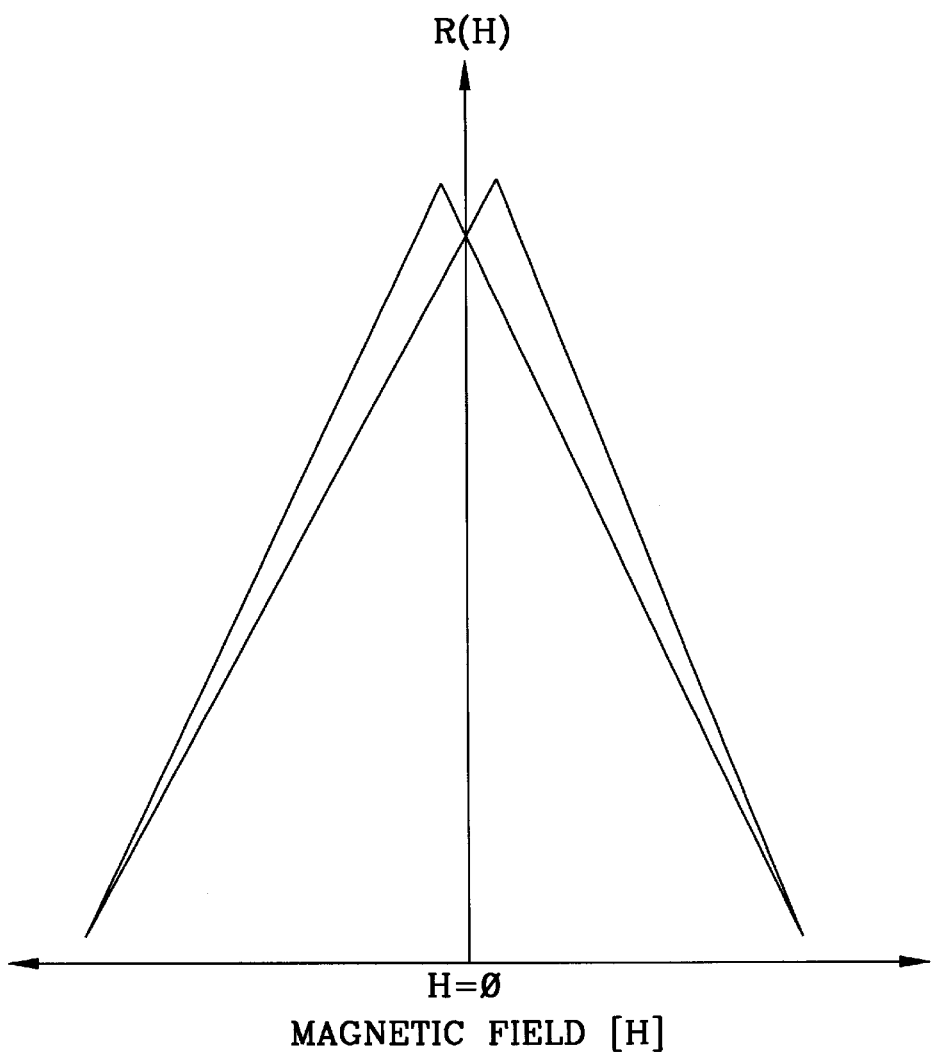
FIG. 1 is a response curve for a typical Colossal magnetoresistive material.
Figure 2:
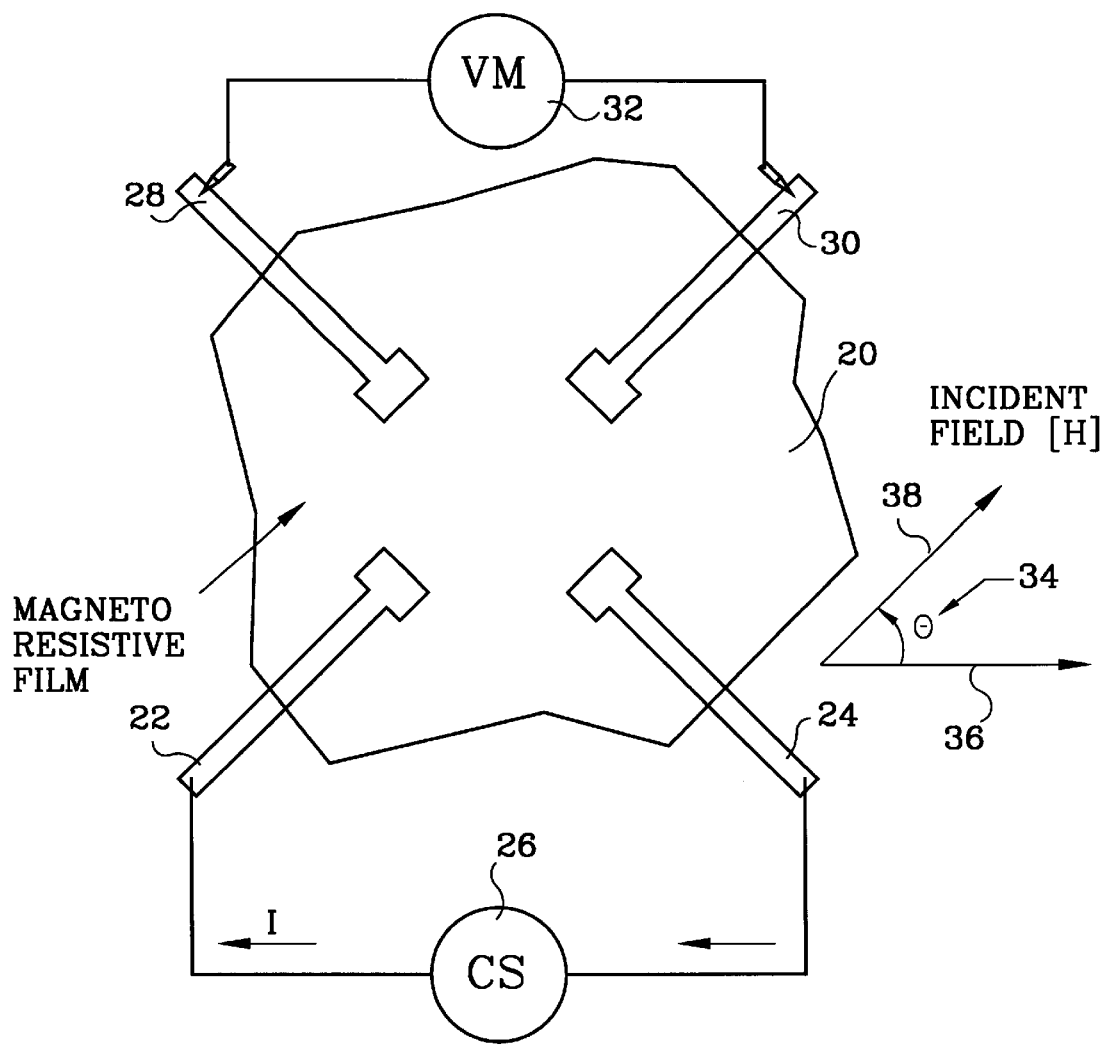
FIG. 2 shows a schematic diagram of a typical resistance measurement of a magnetoresistive film.

As indicated in FIG. 1 and FIG. 2 above, the resistance of the magnetoresistive material of the sensor elements changes when exposed to an incident magnetic field in the sensor plane. Thus, the resistance of the first leg 50 (R1) changes by, for example, ΔR when exposed to a magnetic field. The magnitude of ΔR is typically proportional to the amplitude of the incident magnetic field, as long as the incident magnetic field is within the linear region of the magnetoresistive material.

When exposed to an incident magnetic field, the output voltage can be expressed as:

$$V_{out} = V_s \left[ \frac{R2}{(R1 + \Delta R) + R2)} \right] \qquad (2)$$

where ΔR is the change in voltage of the first leg 50 when exposed to an incident magnetic field. As shown in FIG. 1, ΔR is typically negative. Thus, Vout increases as the amplitude of the incident magnetic field increases. By detecting the change in Vout, the magnitude of the incident magnetic field in the sensor plane can be determined.

To maximize the sensitivity of the magnetic sensor device, the circular shaped sensor elements 62a–62n are preferably formed from a Colossal magnetoresistive material. However, it is contemplated that GMR materials may also be used. Illustrative Colossal magnetoresistive materials are those generally described by the formula (LnA) $MnO_3$, wherein Ln=La, Nd, or Pr and A=Ca, Sr, Ba or Pb. Preferably, the Colossal magnetoresistive material is LaCaMnO, having concentrations of La between 26–32 atomic percent, Ca between 9–20 atomic percent, and Mn between 47–64 atomic percent. More preferably, the Colossal magnetoresistive material is LaCaMnO, having a 28.4 atomic percent concentration of La, a 11.6 atomic percent concentration of Ca, and a 60 atomic percent concentration of Mn.

Magnetoresistive films tend to respond differently to out-of-plane magnetic fields than in-plane fields. This is caused by the very large demagnetization fields that result when one attempts to tilt the magnetization out of the film plane by applying an out-of-plane field. For in-plane magnetic fields, however, the present invention provides a mechanism for measuring the fields isotropically by minimizing the shape anisotropy associated with the sensor elements.

Figure 4:
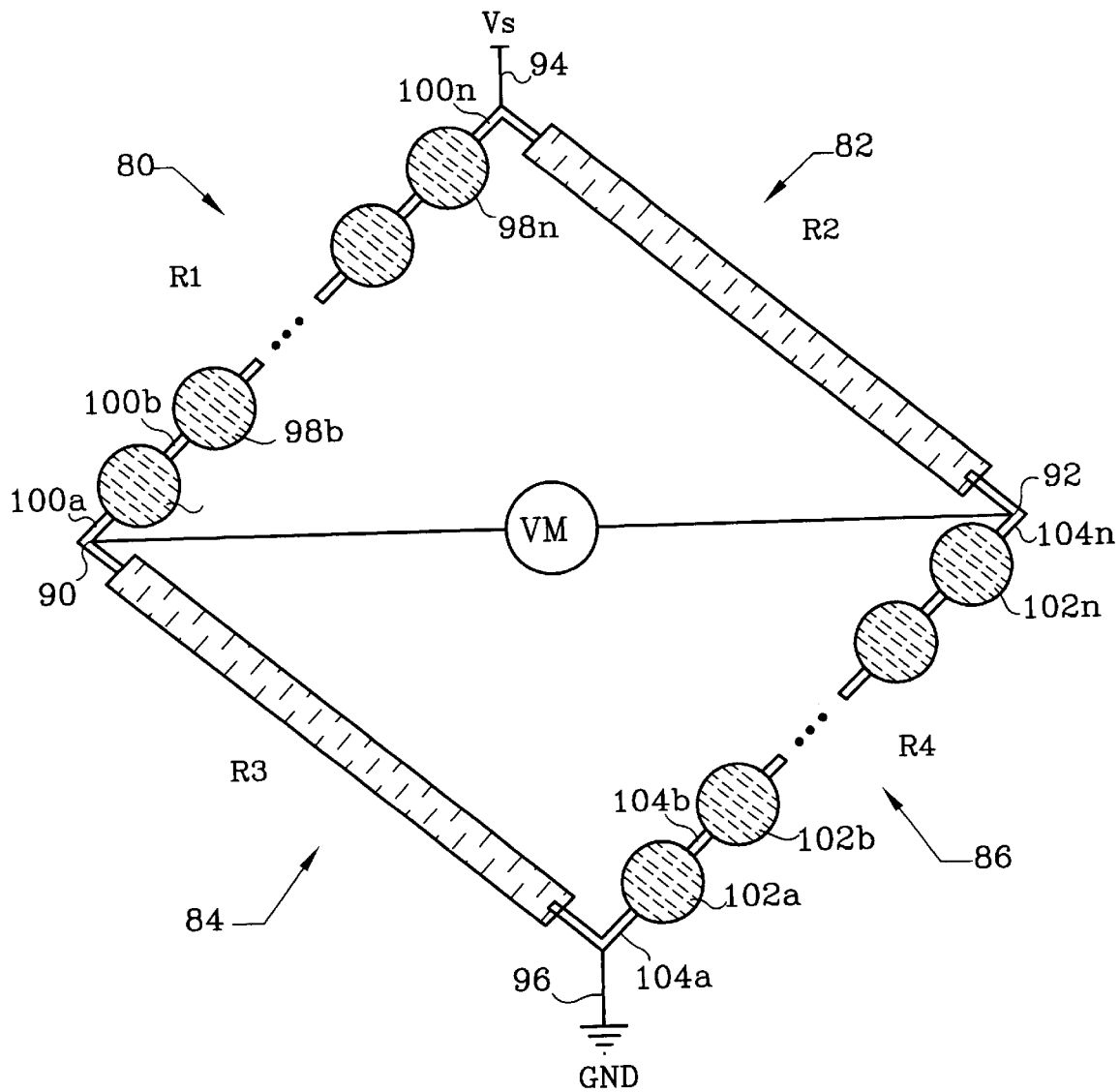
FIG. 4 is a schematic diagram of another illustrative embodiment of the present invention.
Figure 5:
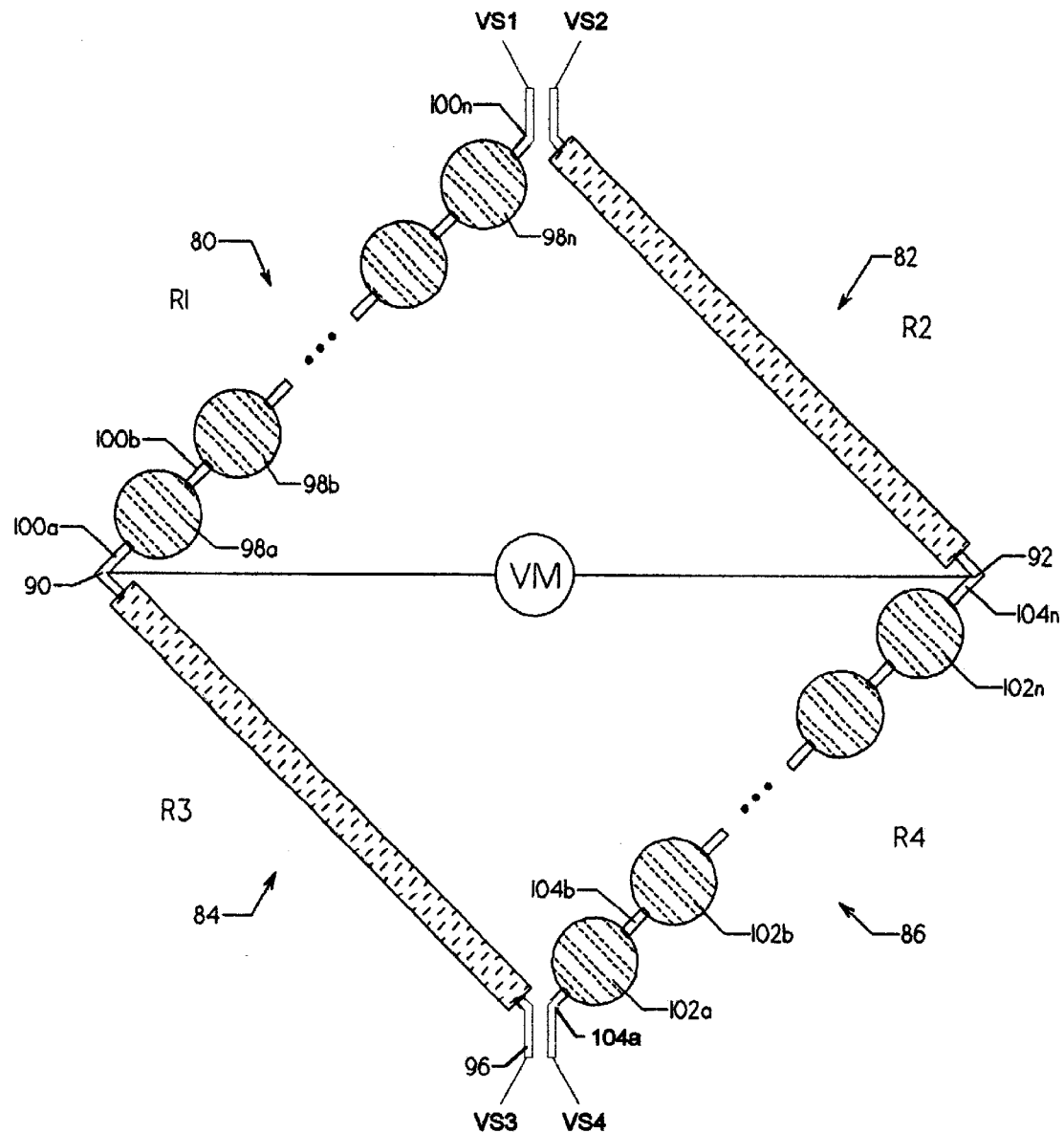
FIG. 5 is a schematic diagram of another illustrative embodiment of the present invention.

FIG. 4 is a schematic diagram of a another illustrative embodiment of the present invention. In this embodiment, the magnetic field sensor includes a first leg 80, a second leg 82, a third leg 84 and a fourth leg 86. The first leg 80 and the second leg 82 preferably are connected between a first output net 90 and a second output net 92, respectively, and a first power supply terminal 94. The third leg 84 and the fourth leg 86 preferably are connected between the first output net 90 and the second output net 92, respectively, and a second power supply 96. It is contemplated that each of the legs 80, 82, 84 and 86 may be connected to a separate power supply, if desired as shown in FIG 5.

To sense an incident magnetic field isotropically, at least one circular shaped sensor element formed from a magnetoresistive material is incorporated into at least one of the first, second, third and fourth legs 80, 82, 84 and 86. Preferably, the first leg 80 has two or more circular shaped magnetoresistive sensor elements 98a–98n. Also, the fourth leg 86 preferably has two or more circular shaped magnetoresistive sensor elements 102a–102n. The second leg 82 and third leg 84 are preferably formed from a non-magnetoresistive material.

The at least one circular shaped sensor elements of the first leg 80 are preferably connected in a series configuration, as shown, via a number of non-magnetoresistive connectors 100a–100n. Likewise, the at least one circular shaped sensor elements of the fourth leg 86 are preferably connected in a series configuration, as shown, via a number of non-magnetoresistive connectors 104a–104n. The circularly shaped magnetoresistive sensor elements are preferably formed from the same Colossal materials as describe above.

There are preferably eight 10–15 μm diameter circular shaped sensor elements in both the first leg 80 and the fourth leg 86. The first leg 80 and the fourth leg 86 also preferably provide the same overall resistance value $R_r$. The second leg 82 and the third leg 84 also preferably provide the same resistance $R_r$. The result is a balanced wheatstone bridge, with substantially no output voltage between the first output net 90 and the second output net 92 when no incident magnetic field is applied.

In this configuration, the output voltage between the first output net 90 and the second output net 92 is provided by the formula:

$$V_{out} = V_s \left[ \frac{R_{2,3} - (R_{1,4} + \Delta R)}{R_{2,3} + (R_{1,4} + \Delta R)} \right], \qquad (3)$$

where $R_{1,4}=R_{2,3}$, and where ΔR is the change in resistance of the first leg 80 and the fourth leg 86 as a result of the incident magnetic field in the sensor plane. As shown in FIG. 1, ΔR is typically negative. Thus, Vout increases as the amplitude of the incident magnetic field increases. By detecting the change in Vout, the magnitude of the incident magnetic field in the sensor plane can be determined.

Having thus described the preferred embodiments of the present invention, those of skill in the art will readily appreciate that the teachings found herein may be applied to yet other embodiments within the scope of the claims hereto attached.

What is claimed is:

1. A magnetic field sensor for producing an output voltage that is proportional to the amplitude of an incident magnetic field in a sensor plane, the magnetic field sensor comprising:
   a first leg having a first end and a second end, said first leg including one or more first circular shaped elements provided in the sensor plane, selected ones of the first circular shaped elements are formed from an isotropic magnetoresistive material, the first end of said first leg is connected to a first power supply terminal;
   a second leg having a first end and a second end, wherein the first end is connected to a second power supply terminal;
   a third leg having a first end and a second end, wherein the first end is connected to a third power supply terminal, and the second end is connected to the second end of the first leg;
   a fourth leg having a first end and a second end, said fourth leg including one or more second circular shaped elements provided in the sensor plane, selected ones of the second circular shaped elements are formed from an isotropic magnetoresistive material, the first end of the fourth leg is connected to a fourth power supply terminal, and the second end of said fourth leg is connected to the second end of the second leg;
   whereby an output voltage is produced between the second end of the first leg and the second end of the second leg that is proportional to the applied magnetic field in the sensor plane and independent of the direction of the magnetic field in the sensor plane.

2. A magnetic field sensor according to claim 1 wherein the first power supply terminal is electrically connected to the second power supply voltage terminal, and the third power supply terminal is electrically connected to the fourth power supply terminal.

3. A magnetic field sensor according to claim 1 wherein the second leg is formed from a non-magnetoresistive material.

4. A magnetic field sensor according to claim 3 wherein the third leg is formed from a non-magnetoresistive material.

5. A magnetic field sensor according to claim 1 wherein said first leg includes two or more first circular shaped elements, and each of the two or more first circular shaped elements are interconnected to at least one other of the first circular shaped elements via a non-magnetoresistive material.

6. A magnetic field sensor according to claim 2 wherein said fourth leg includes two or more second circular shaped elements, and each of the two or more second circular shaped elements are interconnected to at least one other of the second circular shaped elements via a non-magnetoresistive material.

7. A magnetic field sensor according to claim 1 wherein selected ones of the first and second circular shaped elements are formed from a Colossal magnetoresistive material.

8. A magnetic field sensor according to claim 7 wherein the Colossal magnetoresistive material is generally described by the formula LaCaMnO.

9. A magnetic field sensor according to claim 7 wherein the Colossal magnetoresistive material is LaCaMnO, having concentrations of La between 26–32 atomic percent, Ca between 9–20 atomic percent, and Mn between 47–64 atomic percent.

10. A magnetic field sensor according to claim 9 wherein the concentration of La is 28.4 atomic percent, the concentration of Ca is 11.6 atomic percent, and the concentration of Mn is 60 atomic percent.

11. A magnetic field sensor according to claim 9 wherein the Colossal magnetoresistive material is a material generally described by the formula $(LnA)MnO_3$, wherein Ln=La, Nd, or Pr and A=Ca, Sr, Ba or Pb.

12. A magnetic field sensor according to claim 1 wherein selected ones of the first and second circular shaped elements are formed from a giant magnetoresistive material.

* * * * *